United States Patent
Bera et al.

(10) Patent No.: US 11,959,174 B2
(45) Date of Patent: Apr. 16, 2024

(54) SHUNT DOOR FOR MAGNETS IN PLASMA PROCESS CHAMBER

(71) Applicant: Applied Materials, Inc., Santa Clara, CA (US)

(72) Inventors: Kallol Bera, Fremont, CA (US); Sathya Swaroop Ganta, Sunnyvale, CA (US); Timothy Joseph Franklin, Campbell, CA (US); Kaushik Alayavalli, Sunnyvale, CA (US); Akshay Dhanakshirur, Hubli (IN); Stephen C. Garner, Newark, CA (US); Bhaskar Kumar, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 411 days.

(21) Appl. No.: 17/131,315

(22) Filed: Dec. 22, 2020

(65) Prior Publication Data
US 2021/0269919 A1 Sep. 2, 2021

(30) Foreign Application Priority Data

Feb. 28, 2020 (IN) .............................. 202041008541

(51) Int. Cl.
*C23C 16/52* (2006.01)
*C23C 16/505* (2006.01)
(Continued)

(52) U.S. Cl.
CPC ............ *C23C 16/52* (2013.01); *C23C 16/505* (2013.01); *C23C 16/54* (2013.01);
(Continued)

(58) Field of Classification Search
CPC ........... H01J 37/32082; H01J 37/32091; H01J 37/32174; H01J 37/32431;
(Continued)

(56) References Cited

U.S. PATENT DOCUMENTS

| | | | | |
|---|---|---|---|---|
| 6,014,943 A | * | 1/2000 | Arami | H01J 37/32082 156/345.46 |
| 6,190,495 B1 | * | 2/2001 | Kubota | H01J 37/32082 156/345.46 |
| 6,245,190 B1 | * | 6/2001 | Masuda | H01J 37/32678 156/345.46 |
| 6,246,231 B1 | * | 6/2001 | Ashe | G01B 7/003 324/207.17 |

(Continued)

FOREIGN PATENT DOCUMENTS

| | | |
|---|---|---|
| JP | 2017-501569 A | 1/2017 |
| WO | 2006011336 A1 | 2/2006 |

OTHER PUBLICATIONS

International Search Report in related application PCT/US2020/067297 dated Apr. 26, 2021.

*Primary Examiner* — Benjamin Kendall
*Assistant Examiner* — Joshua Reyes
(74) *Attorney, Agent, or Firm* — Patterson + Sheridan, LLP

(57) ABSTRACT

Embodiments described herein relate to magnetic and electromagnetic systems and a method for controlling the density profile of plasma generated in a process volume of a PECVD chamber to affect deposition profile of a film on a substrate and/or facilitate chamber cleaning after processing. In one embodiment, a system is disclosed that includes a rotational magnetic housing disposed about an exterior sidewall of a chamber. The rotational magnetic housing includes a plurality of magnets coupled to a sleeve that are configured to travel in a circular path when the rotational magnetic housing is rotated around the chamber, and a plurality of shunt doors movably disposed between the chamber and the sleeve, wherein each of the shunt doors are configured to move relative to the magnets.

20 Claims, 12 Drawing Sheets

(51) Int. Cl.
*C23C 16/54* (2006.01)
*H01J 37/32* (2006.01)

(52) U.S. Cl.
CPC .. *H01J 37/32082* (2013.01); *H01J 37/32174* (2013.01); *H01J 37/3266* (2013.01); *H01J 37/32669* (2013.01)

(58) Field of Classification Search
CPC ........... H01J 37/32532; H01J 37/32623; H01J 37/3266; H01J 37/32669; H01J 37/32899; H01J 37/3452; H01J 37/3455; H01J 37/3461; H01J 1/50; H01J 1/52; H01J 3/20; H01J 3/32; H01J 17/14; H01J 21/18; H01J 23/087; H01J 23/10; H01J 29/64; H01J 29/707; H01J 29/845; H01J 40/08; H01J 43/14; H01J 61/106; H01J 65/042; H01J 2223/087; H01J 2229/5684; H01J 2229/703; C23C 16/4584; C23C 16/505; C23C 16/52; C23C 16/54; H01L 21/67155; H01L 21/67161; H01L 21/6719; H01L 21/677; H01L 21/67709; H05H 1/00; H05H 1/01; H05H 1/02; H05H 1/16; H05H 1/24; H05H 1/245; H05H 1/50

See application file for complete search history.

(56) References Cited

U.S. PATENT DOCUMENTS

| | | |
|---|---|---|
| 6,436,230 B1 | 8/2002 | Kondo et al. |
| 2004/0155592 A1* | 8/2004 | Madocks ............... C23C 16/545 315/111.21 |
| 2005/0211383 A1* | 9/2005 | Miyata ............... H01L 21/67069 156/345.46 |
| 2005/0247885 A1* | 11/2005 | Madocks ............... F03H 1/0075 250/423 R |
| 2008/0277063 A1 | 11/2008 | Shin |
| 2009/0236218 A1 | 9/2009 | Teer |
| 2009/0302984 A1* | 12/2009 | Stephenson .......... G01R 33/383 335/306 |
| 2011/0311735 A1* | 12/2011 | Wang ................... H01J 37/3408 427/571 |
| 2014/0060980 A1* | 3/2014 | Piech ..................... H02K 7/106 188/267 |
| 2016/0035547 A1* | 2/2016 | Johanson ............ H01J 37/3452 204/192.12 |
| 2016/0248309 A1* | 8/2016 | Copeland, Jr. ......... H02K 1/187 |
| 2018/0115204 A1* | 4/2018 | Gieras ................... H02K 1/187 |
| 2019/0244754 A1 | 8/2019 | Yang et al. |
| 2020/0144029 A1 | 5/2020 | Gandikota et al. |
| 2020/0370177 A1 | 11/2020 | Franklin et al. |

\* cited by examiner

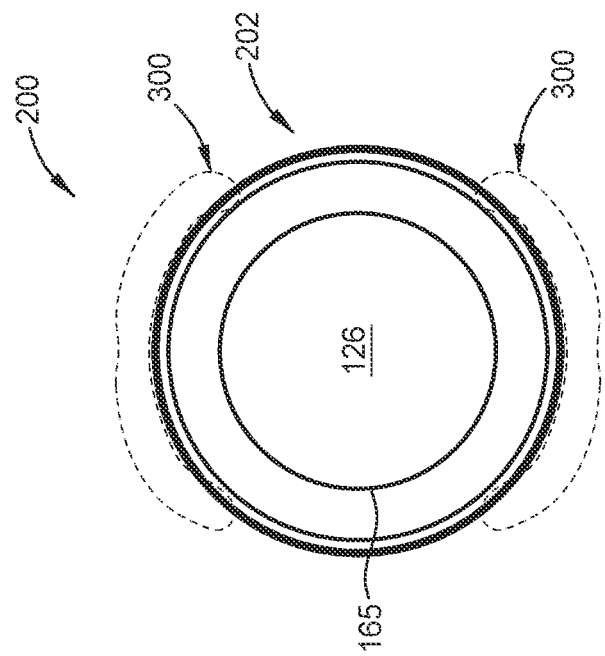
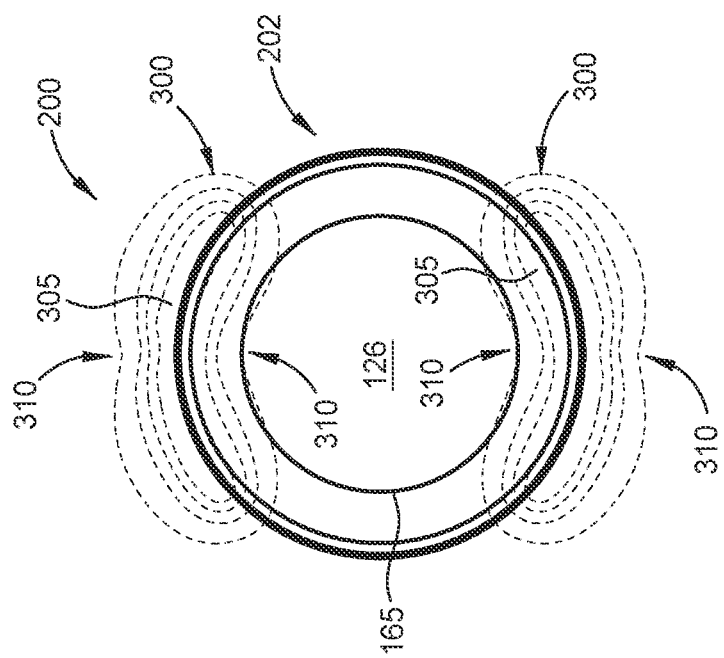
FIG. 3B
FIG. 3A

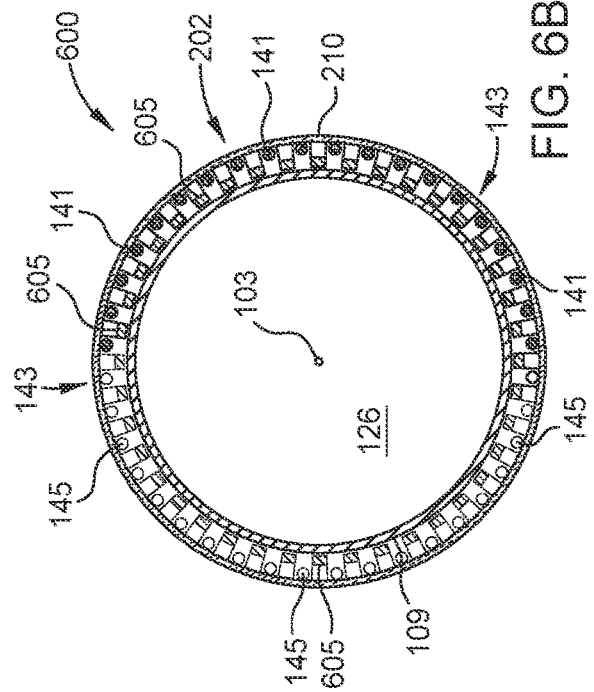
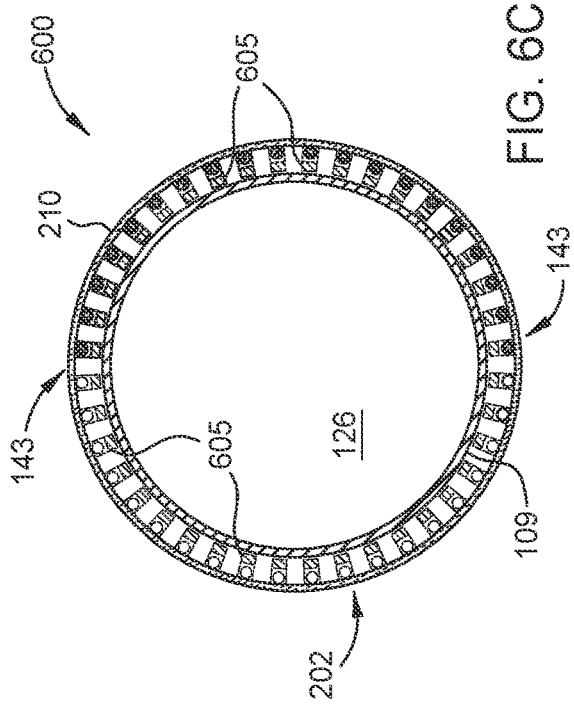
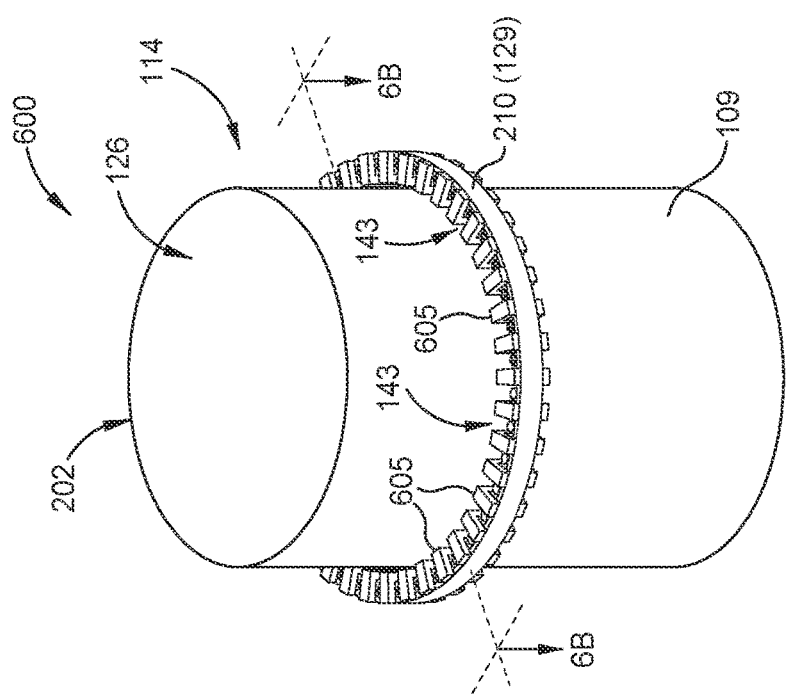

SHUNT DOOR FOR MAGNETS IN PLASMA PROCESS CHAMBER

CROSS-REFERENCE TO RELATED APPLICATION

This application claims benefit of Indian Provisional Application Serial Number 202041008541, filed Feb. 28, 2020, which is incorporated by reference herein.

BACKGROUND

Field

Embodiments of the present disclosure generally relate to magnetic housing systems for controlling properties of a generated plasma as well as controlling magnetic fields of the magnetic housing system, and plasma enhanced deposition systems having the same.

Description of the Related Art

Plasma enhanced chemical vapor deposition (PECVD) is generally employed to deposit a film on a substrate, such as a semiconductor wafer. Plasma etching is generally employed to etch a film disposed on a substrate. PECVD and plasma etching are accomplished by introducing one or more gases into a process volume of a process chamber that contains a substrate. The one or more gases mix in a diffuser situated near the top of the chamber and are injected into a process volume through a plurality of holes or nozzles of the diffuser. During PECVD and plasma etching, the mixture of the one or more gases in the process volume are energized (e.g., excited) to generate a plasma by applying radio frequency (RF) energy to the chamber from one or more RF sources coupled to the chamber. An electric field is generated in the process volume such that atoms of a mixture of the one or more gases present in the process volume are ionized and release electrons. In addition, radicals are generated by the impact of energetic electrons. The ions as well as radicals accelerated to the substrate support in PECVD facilitate deposition of a film on the substrate. The ions and radicals accelerated to the substrate support in plasma etching facilitate etching of a film disposed on the substrate.

The plasma generated in the process volume has properties, such as a density profile. A non-uniform density profile may cause non-uniform deposition or etching of the film on the substrate. In particular, the density profile of the plasma affects the deposition thickness or the etch profile of the film across a surface of the substrate.

Accordingly, what is needed in the art are systems and a method for controlling the properties of the plasma generated in a process volume of a PECVD chamber.

SUMMARY

In one embodiment, a system is provided. The system includes a rotational magnetic housing disposed about an exterior sidewall of a chamber. The rotational magnetic housing includes a plurality of magnets coupled to a sleeve that are configured to travel in a circular path when the rotational magnetic housing is rotated around the chamber, and a plurality of shunt doors movably disposed between the chamber and the sleeve, wherein each of the shunt doors are configured to move relative to the magnets.

In another embodiment, a system is provided. The system includes a rotational magnetic housing disposed about a chamber, the rotational magnetic housing comprising a plurality of magnets coupled to a sleeve that are configured to travel in a circular path about an exterior surface of the chamber, and a plurality of shunt doors disposed between exterior surface of the chamber and the sleeve, wherein each of the shunt doors are configured to move relative to the magnets, and the magnets are configured to move relative to the plurality of shunt doors.

In yet another embodiment, a chamber is provided. The chamber includes a chamber body, a chamber lid having a gas distribution assembly, a substrate support positioned opposite the gas distribution assembly to define a process volume, the process volume having a center axis, a radio frequency (RF) source operable to be coupled to an electrode disposed within substrate support, and a rotational magnetic housing disposed about an exterior wall of the chamber. The rotational magnetic housing includes a plurality of magnets coupled to a sleeve that are configured to travel in a circular path when the rotational magnetic housing is rotated around the chamber, and a plurality of shunt doors movably disposed between the chamber and the sleeve, wherein each of the shunt doors are configured to move relative to the magnets.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 3A and 3B are schematic sectional views of the chamber body showing the B-field magnitude in the chamber when the shunt doors are in the first position and the second position, respectively.

FIG. 6A is an isometric view of another embodiment of a movable shunt door system wherein shunt doors are in a first position.

FIG. 6B is a sectional view along lines 6B-6B of FIG. 6A.

FIG. 6C is a sectional view similar to FIG. 6B with the shunt doors 605 in a second position.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide magnetic and electromagnetic housing systems and a method for controlling the properties of plasma generated in a process volume of a PECVD chamber to affect deposition properties of a film. In one embodiment, a plurality of magnets is disposed in a rotational magnetic housing of the magnetic housing system disposed about a process volume. Embodiments disclosed herein include one or more movable shunt doors that selectively blocks the magnetic field from the magnets in the process volume. The shunt doors are made of magnetic material with high permeability and are selectively placed between the chamber and the magnets. The shunt doors are moved (e.g., rotated) relative to the chamber and the magnets. Rotating the shunt door places the doors and/or magnets in either an open or a closed position. When the shunt doors are in open position a magnetic B-field penetrates the process volume 126 during processing. At the end of process, during purge, the shunt doors are rotated relative to the magnets to a closed position that shields the B-field in the process volume. This allows effective purging of particles which reduces the defect count on a processed substrate.

Figure 1A:
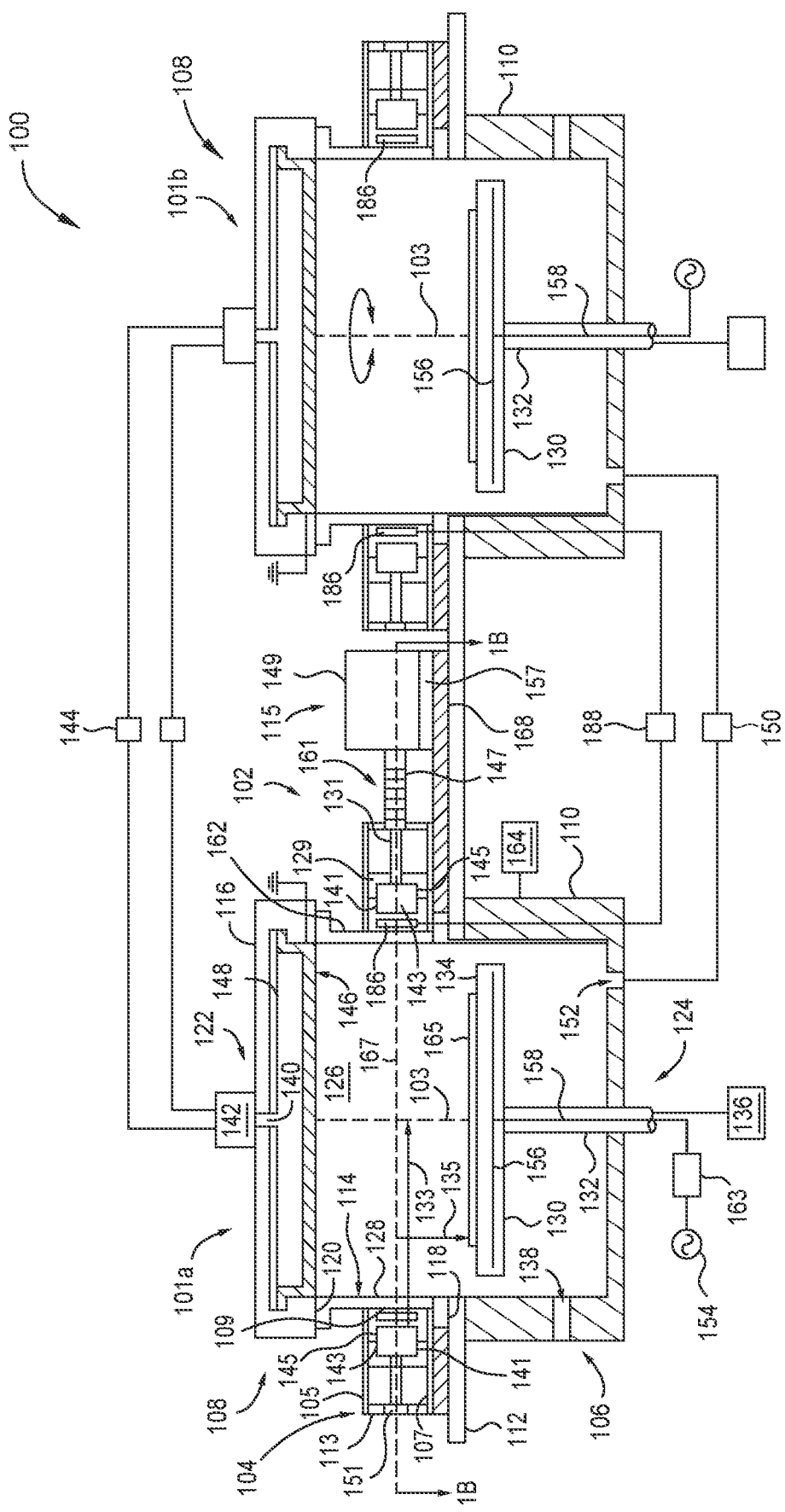
FIG. 1A is a schematic cross-sectional view of a plasma-enhanced chemical vapor deposition (PECVD) chamber having a rotational magnetic housing system with a rotational magnetic housing disposed outside of the chamber according to one embodiment.
Figure 1B:
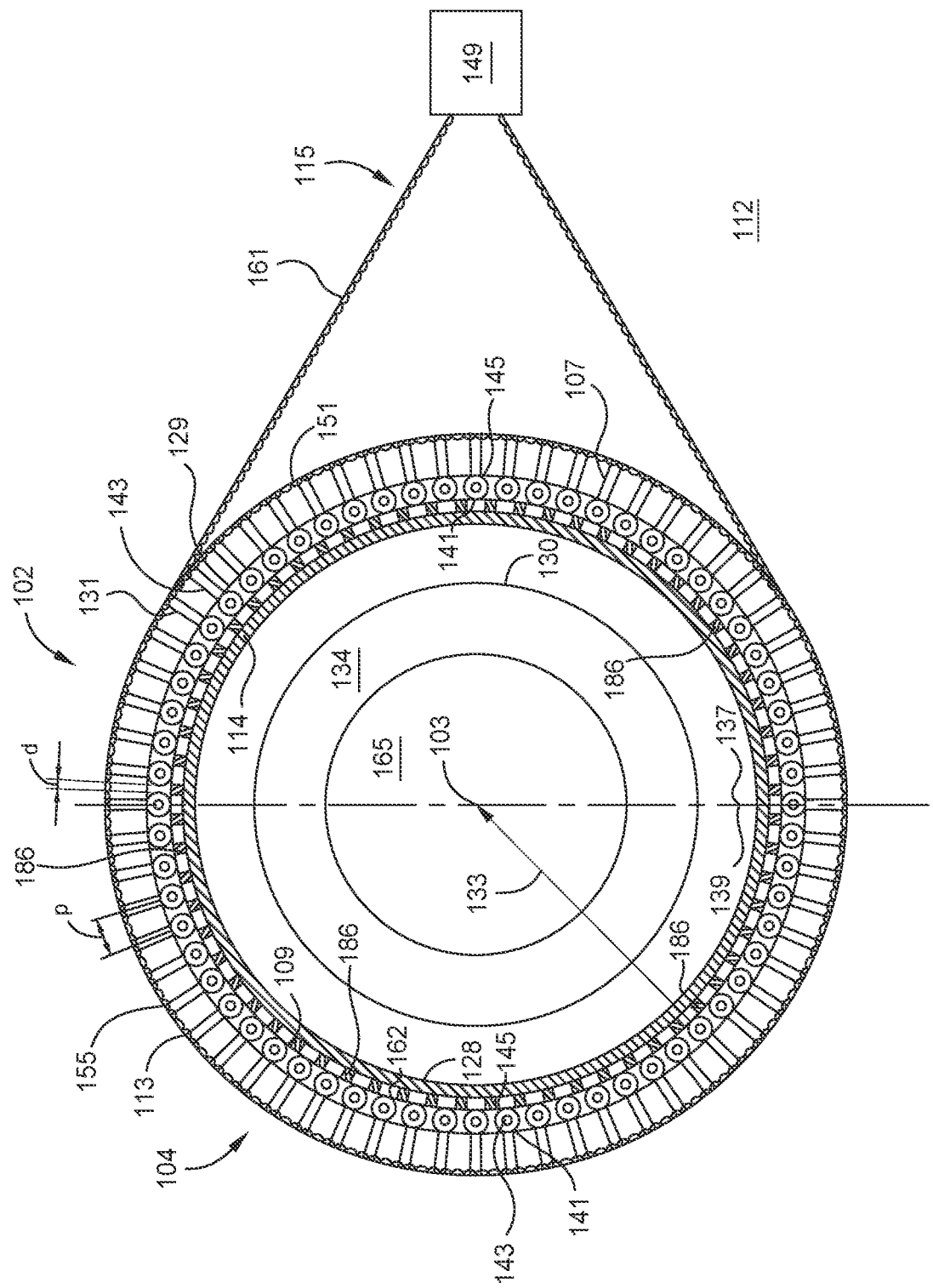
FIG. 1B is a schematic top view of a rotational magnetic housing system according to one embodiment.

FIGS. 1A and 1B are various schematic views of a plasma-enhanced chemical vapor deposition (PECVD) system 100. FIG. 1A is a schematic cross-sectional view of the system 100. One example of the system 100 is a PRODUCER® system manufactured by Applied Materials, Inc., located in Santa Clara, Calif. It is to be understood that the system described below is an exemplary chamber system and other systems and/or chambers, including systems and/or chambers from other manufacturers, may be used with or modified to accomplish aspects of the present disclosure.

The system 100 includes a chamber 101a (e.g., first chamber) and a chamber 101b (e.g., second chamber). In one embodiment, which can be combined with other embodiments described herein, the chambers 101a, 101b share facilities resources. For example, the chambers 101a, 101b may share at least one or more gas sources 144, a mounting plate 112, and a pump 150. However, it is also contemplated that each of chambers 101a, 101b have dedicated resources.

In the embodiments of FIG. 1A, each chamber 101a, 101b has a rotational magnetic housing system 102 with a rotational magnetic housing 104 disposed outside of the chamber 101a, 101b. Although the chambers are substantially identical, reference numerals may be omitted on the chamber 101b for clarity in FIG. 1A.

The chambers 101a, 101b has a chamber body assembly 106 and a chamber lid assembly 108. The chamber body assembly 106 of the embodiments of FIG. 1A includes a chamber body 110 coupled to a mounting plate 112. The chamber lid assembly 108 of the embodiments of FIG. 1A includes a spacer 114 that functions as a plasma chamber body. The spacer 114 includes a first flange 118 coupled to the mounting plate 112 and a chamber lid 116 coupled to a second flange 120 of the spacer 114. The chamber lid 116 includes a gas distribution assembly 122. The gas distribution assembly 122 is positioned opposite a substrate support assembly 124 defining a process volume 126 therebetween. The process volume 126 of the embodiments of FIG. 1A is further defined by the chamber lid 116, an interior wall 128 of the spacer 114, mounting plate 112, and chamber body 110. The interior wall 128 is opposite to an outer wall 109 of the spacer 114.

The substrate support assembly 124 is disposed within the process volume 126. The substrate support assembly 124 includes a substrate support 130 and a stem 132. The substrate support 130 has a support surface 134 for supporting a substrate 165. The substrate support 130 typically includes a heating element (not shown). The substrate support 130 is movably disposed in the process volume 126 by the stem 132 which extends through the chamber body 110 where the stem 132 is connected to a substrate support drive system 136. The substrate support drive system 136 moves the substrate support 130 between an elevated processing position (as shown) and a lowered position that facilitates substrate transfer to and from the process volume 126 through a slit valve 138 formed though the chamber body 110. In one embodiment, which can be combined with other embodiments described herein, the substrate support drive system 136 rotates the stem 132 and the substrate support 130.

In one embodiment, the gas distribution assembly 122 is configured to distribute gases uniformly into the process volume 126 of the chamber 101a, 101b to facilitate deposition of a film, such as an advanced patterning film, on the substrate 165 positioned on the substrate support 130 of the substrate support assembly 124. In another embodiment, the gas distribution assembly 122 is configured to distribute gases uniformly into the process volume 126 of the chamber 101a, 101b to facilitate etching of a film, such as an advanced patterning film, disposed on the substrate 165 positioned on the substrate support 130 of the substrate support assembly 124.

The gas distribution assembly 122 includes a gas inlet passage 140, which delivers gases from a flow controller 142 coupled to one or more gas sources 144 through a diffuser 146 suspended from a hanger plate 148. The diffuser 146 includes a plurality of holes or nozzles (not shown) through which gaseous mixtures are injected into the process volume 126 during processing. The pump 150 is coupled to an outlet 152 of the chamber body 110 for controlling the pressure within the process volume 126 and exhausting byproducts (e.g., purging particles) from the process volume 126. The diffuser 146 of gas distribution assembly 122 can be connected to an RF return (or ground) allowing RF energy applied to the substrate support 130 to generate an electric field within the process volume 126, which is used to generate the plasma for processing of the substrate 165.

A RF source 154 is coupled to the electrode 156 disposed within substrate support 130 through a conductive rod 158 disposed through the stem 132. In one embodiment, which can be combined with other embodiments described herein, the electrode 156 is connected to the RF source 154 through a match box 163 having a match circuit for adjusting and a sensor for measuring electrical characteristics, such as voltage, current, and impedance, of the electrode 156. The match circuit may facilitate adjustment of voltage, current, or impedance in response to a signal from the sensor. The diffuser 146 of gas distribution assembly 122, which is connected to an RF return, and the electrode 156 facilitate formation of a capacitive plasma coupling. The RF source 154 provides RF energy to the substrate support 130 to facilitate generation of a capacitive coupled plasma between the substrate support 130 and the diffuser 146 of the gas distribution assembly 122. When RF power is supplied to the electrode 156, an electric field is generated between the diffuser 146 and the substrate support 130 such that atoms of gases present in the process volume 126 between the substrate support 130 and the diffuser 146 are ionized and release electrons. The ionized atoms accelerated to the substrate support 130 facilitate deposition or etching of the film the substrate 165 positioned on a substrate support 130.

FIG. 1B illustrates a schematic top view of the rotational magnetic housing system 102 of FIG. 1A. Referring to FIG. 1A and FIG. 1B, the rotational magnetic housing system 102 includes the rotational magnetic housing 104 configured to rotate about a center longitudinal axis 103 of the process volume 126 and/or the spacer 114 (e.g., the plasma chamber body) to create static or dynamic magnetic fields. The magnetic fields modify the shape of the plasma, concentration of ions and radicals, and movement of concentration of ions and radicals to control the density profile of the plasma within the process volume 126.

The rotational magnetic housing system 102 with the rotational magnetic housing 104 is disposed outside of the chamber 101a, 101b. The rotational magnetic housing system 102 includes an upper plate 105, a lower plate 107 disposed opposite to the upper plate 105, the outer wall 109 of the spacer 114, an outer sidewall 113 disposed opposite the outer wall 109, a housing lift system 168, and a housing drive system 115. The interior wall 128 defines a round central opening. In one embodiment, which can be combined with other embodiments described herein, at least one of the upper plate 105, lower plate 107, and spacer 114 includes one or more channels (not shown) connected to a heat exchanger (not shown) to control a temperature profile of the rotational magnetic housing 104. An exterior portion 162 of the outer wall 109 of the spacer 114 includes a polymer material, such as PTFE (polytetrafluoroethylene). In one embodiment, which can be combined with other embodiments described herein, the exterior portion 162 is a sheet of polymer material. The polymer material of the exterior portion 162 of the spacer 114 allows the rotational magnetic housing 104 to rotate around the spacer 114 about the center longitudinal axis 103 of the process volume 126 and/or the spacer 114. A controller 164 is coupled to the chambers 101a, 101b and the rotational magnetic housing system 102, which is configured to control aspects of the chamber 101a, 101b and aspects of the rotational magnetic housing system 102 during processing and after processing.

The rotational magnetic housing 104 shown includes a plurality of retaining brackets 129. Each retaining bracket of the plurality of retaining brackets 129 is disposed in the rotational magnetic housing 104 with a distance d between each retaining bracket 129. The plurality of retaining brackets 129 enables a plurality of magnets 143 to be disposed in or removed from the rotational magnetic housing 104. In one embodiment, each magnet 143 of the plurality of magnets 143 is retained in a retaining bracket 129 with a pitch p between each magnet 143 of the plurality of magnets 143. The pitch p corresponds to a distance between each adjacent magnet 143 of the plurality of magnets 143. The pitch p tunes the magnetic fields generated by rotating the rotational magnetic housing 104. In one embodiment, which can be combined with other embodiments described herein, each of the retaining brackets 129 is coupled to tracks 131. The retaining brackets 129 are actuated such that each of the retaining brackets 129 are operable to slide along the tracks 131 in a radial direction to vary a horizontal distance 133 from each of the magnets 143 to the center longitudinal axis 103 of the process volume 126 and/or the spacer 114. Coupling the electromagnet housing 172 to the housing lift system 168 facilities vertical adjustment of the electromagnet housing 172 relative to a substrate 165. For example, a vertical distance 135 (shown in FIG. 1A), defined by a plane 167 formed through a center of each of the magnets 143 to the substrate 165, can be increased or decreased to adjust properties of plasma maintained within a corresponding chamber 101a or 101b.

In one embodiment, as shown in FIG. 1B, which can be combined with other embodiments described herein, a first half 137 (e.g., encompassing about 180 degrees) of the rotational magnetic housing 104 has the magnets 143 with the north pole 141 oriented along the center longitudinal axis of the process volume 126 towards the top surface 146. A second half 139 (e.g., encompassing about 180 degrees) of the rotational magnetic housing 104 has the magnets 143 with the South pole 145 oriented along the center longitudinal axis of the process volume 126 towards the top surface 146.

The rotational magnetic housing 104 is coupled to the housing drive system 115. The housing drive system 115 includes a belt 1117161 and a motor 149. In one embodiment, which can be combined with other embodiments described herein, the motor 149 is coupled to the housing lift system 168 by a mounting bracket 157. The rotational magnetic housing 104 includes a plurality of grooves 151 formed in an outer sidewall 113 of the rotational magnetic housing 104. Each groove of the plurality of grooves 151 corresponds to a lug 155 of a plurality of lugs 155 of the belt 161. The belt 161 is configured to be disposed around the rotational magnetic housing 104 and is coupled to the motor 149, such as a brushless DC electric motor. The housing drive system 115 is configured to rotate the rotational magnetic housing 104 about the center longitudinal axis 103 of the process volume 126 at a rotation rate. The rotation rate controls a current distribution over the substrate 165 resulting from the modified magnetic fields. In one example, it is contemplated that each of chambers 101a, 101b includes individual housing drive systems 115. In another example, it is contemplated that each of chambers 101a, 101b share a housing drive system 115.

Plasma processes that utilize a magnetic field as described herein enables enhanced process uniformity, however, particle defects on a processed substrate have been detected with purge gas application in presence of the magnetic field. For example, a plurality of magnets 143 in a ring around the spacer 114 cause a drift in electrons that provides more uniform deposition on a substrate. However, it has been determined that the defects on the substrate cannot be avoided with purge cleaning in presence of a strong magnetic field by the plurality of magnets 143. The magnetic field needs to be minimized in the plasma process region during purge to maximize particle cleaning which in turn minimizes the particle defects on the substrate.

In order to minimize the magnetic field in the process volume 126, the rotational magnetic housing 104 includes a plurality of shunt doors 186 (shown in FIGS. 1A and 1B). Each of the shunt doors 186 are moved (e.g., rotated) relative to the spacer 114 and/or the magnets 143 to an "open" position or a "closed" position. In the open position, which is shown in FIG. 1B, the magnetic field is allowed to penetrate into the process volume 126. In the closed position, the shunt doors 186 are moved to effectively block the magnetic field. Moving or rotating the shunt doors 186 to the open position allows B-field penetration in the process volume 126 during processing. At the end of plasma process, during a purge process, the shunt doors 186 are moved or rotated relative to the magnets to the closed position that shields the B-field in the process volume 126. This allows effective purging of particles, which reduces the defect count on a processed substrate.

Each of the shunt doors 186 are coupled to a door drive actuator 188 that moves the shunt doors 186 relative to the magnets 143 and/or the spacer 114. For example, the door drive actuator 188 moves or rotate the shunt doors 186 relative to the magnets 143 such that individual shunt doors 186 move to a position in between each of the magnets 143 (e.g., the closed position) to effectively minimize the magnetic field in the process volume 126. This minimization of magnetic flux in the process volume 126 enables particles to be purged from the process volume 126 more effectively. Similarly, the door drive actuator 188 moves or rotates the shunt doors 186 relative to the magnets 143 such that individual shunt doors 186 move to a position that is axially in between each of the magnets 143 (e.g., the open position) to allow the magnetic field into the process volume 126. In this position, the shunt doors 186 are moved such that the magnets 143 are not shielded by the shunt doors 186 and B-field penetration in the process volume 126 during processing is provided. The door drive actuator 188 may be configured similarly to the housing drive system 115 described above.

Moving the shunt doors 186 in the open position allows a strong magnetic field for uniform deposition, and in closed position allows enhanced particle purge. The movement time of the shunt doors 186 from the open position to the closed position is short (about 100 milli-seconds to about 1.5 seconds) allowing the particle purge to happen quickly, which saves time. Each of the shunt doors 186 may be made of a ferromagnetic alloy having high permeability. Examples of materials include nickel-iron alloys, such as those sold under the tradename MUMETAL®. The material of the shunt doors 186 includes a relative magnetic permeability ($\mu_r$) of about 80,000.

Figure 2B:
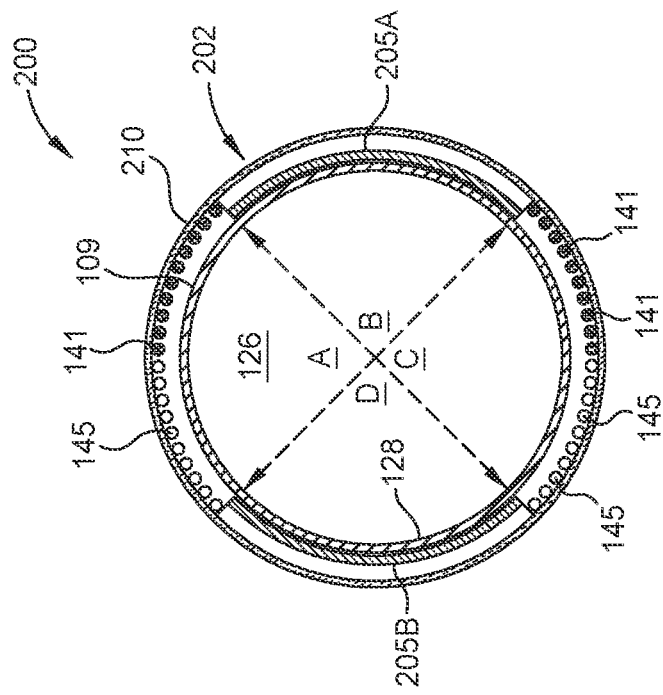
FIG. 2B is a sectional view along lines 2B-2B of FIG. 2A.
Figure 2A:
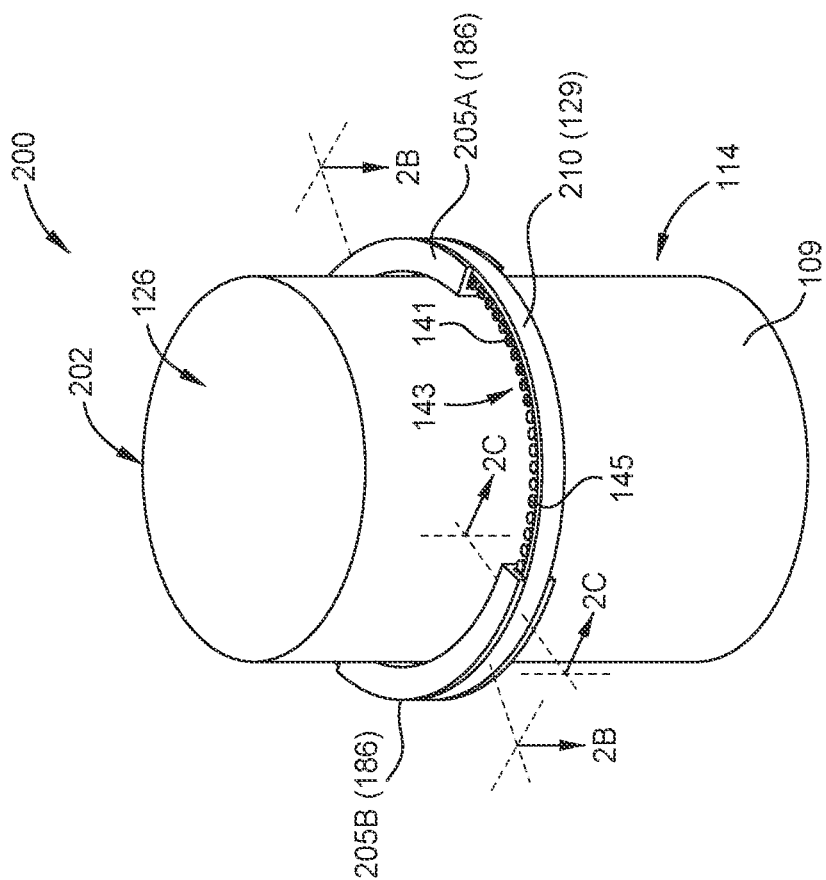
FIG. 2A is an isometric view of one embodiment of a movable shunt door system wherein shunt doors are in a first position.
Figure 2C:
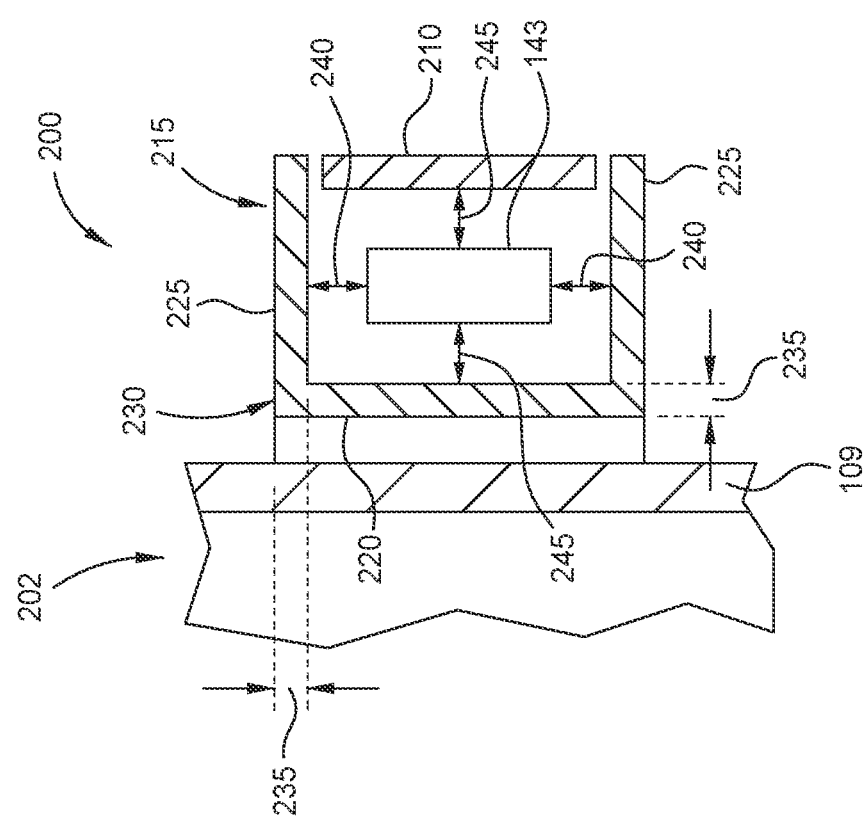
FIG. 2C is a sectional view along lines 2C-2C of FIG. 2A.
Figure 2E:
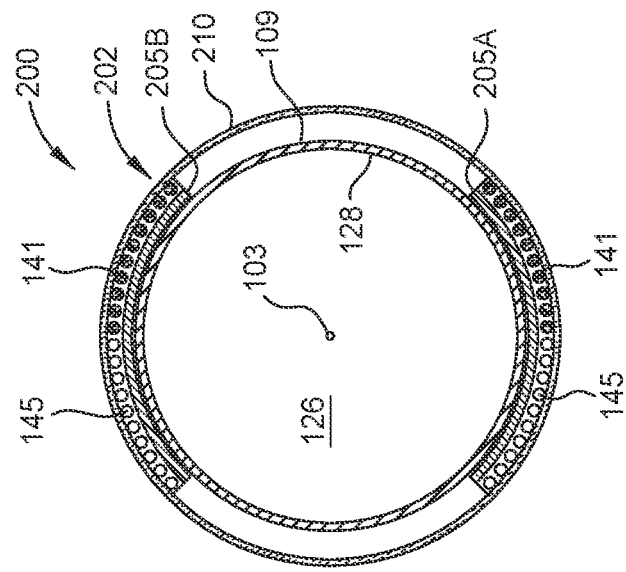
FIG. 2E is a sectional view along lines 2E-2E of FIG. 2D.
Figure 2D:
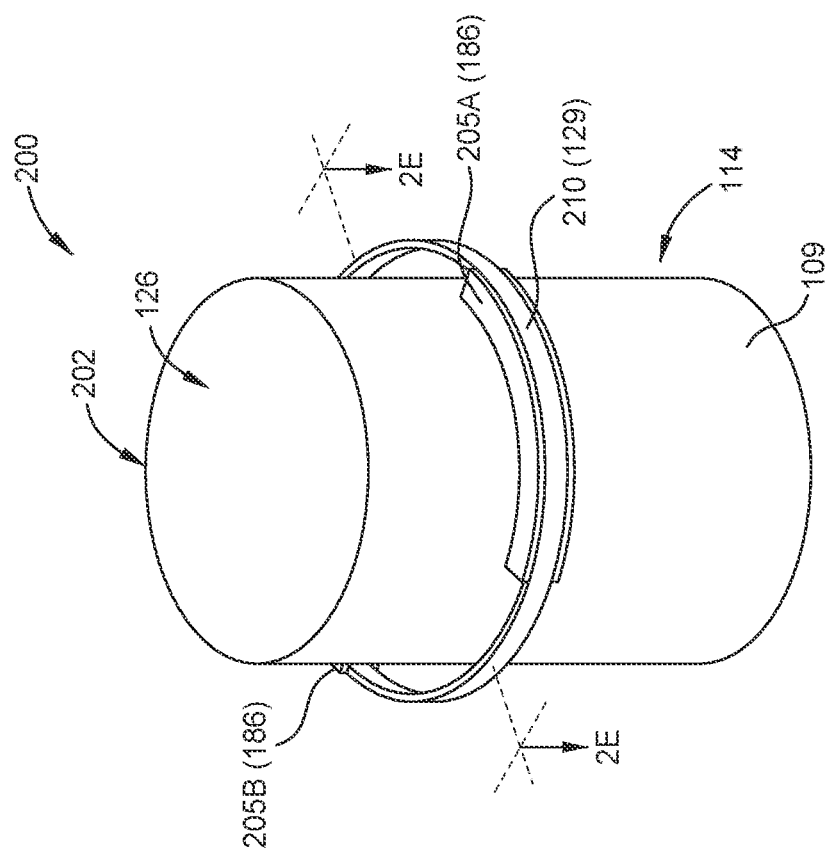
FIG. 2D is an isometric view of the movable shunt door system of FIG. 2A wherein shunt doors are in a second position.

FIGS. 2A-2E are various views of one embodiment of a movable shunt door system 200. FIGS. 2A and 2D are isometric views of a portion of a chamber body 202, which may be the chambers 101a, 101b of FIG. 1A. In this embodiment, two opposing shunt doors 205A and 205B are shown, which are the shunt doors 186 described in FIGS. 1A and 1B. A sleeve 210 that retains the magnets 143, which is the retaining bracket 129 shown in FIGS. 1A and 1B, is shown in FIGS. 2A-2E. FIG. 2A shows the shunt doors 205A and 205B in a first (open) position. FIG. 2B is a sectional view along lines 2B-2B of FIG. 2A. FIG. 2C is a sectional view along lines 2C-2C of FIG. 2A. FIG. 2D is an isometric view similar to FIG. 2A with the shunt doors 205A and 205B in a second (closed) position. FIG. 2E is a sectional view along lines 2E-2E of FIG. 2D. In addition, FIGS. 3A and 3B are schematic sectional views of the chamber body 202 showing the B-field magnitude of the magnets 143 when the shunt doors 205A and 205B are in the open position as shown in FIG. 2B and the closed position in FIG. 2D, respectively. The outline of the substrate 165 is shown in the process volume 126 of the chamber body 202 of FIGS. 3A and 3B. The B-field magnitude shown in FIGS. 3A and 3B are along a horizontal plane (orthogonal to the center longitudinal axis 103 of the process volume 126) through the middle of the magnets 143.

In this embodiment, which can be combined with other embodiments as described herein, the chamber body 202 is divided magnetically into portions, such as quadrants A-D (shown in FIG. 2B). Opposing quadrants A and C include a plurality of magnets 143 while opposing quadrants B and D do not include magnets 143. In addition, one half of the plurality of magnets 143 in quadrants A and C have the south pole 145 oriented toward the center longitudinal axis 103 of the process volume 126 while the other half have the north pole 141 oriented toward the center longitudinal axis 103 of the process volume 126. The North pole 141/south pole 145 divide is the center of each of the respective quadrants A and C.

FIG. 2C is a cross-section of a shunt door 215 which may be either of the shunt doors 205A and 205B shown in FIG. 2A, 2B, 2D or 2E. A portion of the outer wall 109 and the sleeve 210 is also shown in FIG. 2C.

In one embodiment, which can be combined with other embodiments described herein, the shunt door 215 has a "C" shape in sectional view. The shunt door 215 includes a central wall 220, and two opposing outer walls 225 that extend generally orthogonally from the central wall 220. The outer walls 225 extend from the central wall 220 having surfaces in a plane that is generally normal to the center longitudinal axis 103 of the process volume 126. The central wall 220 and the outer walls 225 comprise a body 230 that generally encompasses or surrounds the magnets 143 on at least three sides thereof when the shunt doors are placed in proximity to the magnet(s) (e.g., the closed position). For example, the body 230, having the "C" shape is sized and constructed to block the B-field of the magnets 143 when positioned in the closed position.

A thickness 235 of the central wall 220 and/or the outer walls 225 may be about 0.04 inches to 0.12 inches (about 1 to 3 millimeters) which is thick enough to render easy manufacturing and thin enough to house the magnets comfortably. A distance 240 between the inner surface of the outer walls 225 to the outer surface of the magnet(s) 143 is about 0.08 to 0.5 inches (about 2 millimeters to about 13 millimeters). A distance 245 between the inner surface of the central wall 220 and the outer surface of the magnet(s) 143 is about 0.08 to 0.5 inches (about 2 millimeters to about 13 millimeters).

In FIGS. 2A and 2B, the shunt doors 205A and 205B are in an open position while in FIGS. 2D and 2E, the shunt doors 205A and 205B are in a closed position. The open position allows a strong B-field in the process volume 126 for uniform deposition, and in the closed position, the B-field is minimized in the process volume 126, which allows enhanced particle purge (cleaning of the process volume 126).

In this embodiment, which can be combined with other embodiments as described herein, the open position and the closed position may be caused by one or both of movement of the magnets 143 relative to the shunt doors 205A and 205B (using the housing drive system 115 of the rotational magnetic housing 104 (both shown in FIGS. 1A and 1B) and movement of the shunt doors 205A and 205B using the door drive actuator 188 (shown in FIG. 1A). For example, the shunt doors 205A and 205B rotate about the center longitudinal axis 103 of the process volume 126 relative to the magnets 143 from the open position shown in FIG. 2B to shield the magnets 143 from the process volume 126 as shown in FIGS. 2D and 2E.

The B-field is referenced as reference numeral 300 and is shown schematically in FIGS. 3A and 3B with no rotational movement of the magnets 143 relative to the process volume 126. FIG. 3A shows a magnitude of the B-field 300 when the shunt doors 205A and 205B are in the open position as shown in FIG. 2B. The dashed lines in FIG. 3A shows the magnitude of the B-field 300 having a center volume 305 that decreases in intensity at a peripheral volume 310. FIG. 3B shows the magnitude of the B-field 300 when the shunt doors 205A and 205B are in the closed position as shown in FIGS. 2D and 2E, which effectively lowers the intensity of the B-field 300 in the process volume 126 as compared to the magnitude shown in FIG. 3A. In one example, the magnitude of the B-field 300 shown in FIG. 3B is less than the magnitude of the B-field 300 at the peripheral volume 310 of FIG. 3A. In another example, the average B-field 300 inside the process volume 126 of FIG. 3A is about 24 Gauss while the average B-field 300 is about 0.28 Gauss inside the process volume 126 of FIG. 3B. In another example, the average magnetic field penetration inside the process volume 126 as a radial distance from the chamber wall (e.g., the outer wall 109 of the spacer 114) inwards where the magnetic field is greater than 5 Gauss (in percentage of a chamber wall radius) in the open position (FIG. 3A) is about 37.3% of the chamber wall radius. In contrast, the average magnetic field penetration inside the process volume 126 in the closed position (FIG. 3B) is about 0.18% of the chamber wall radius. Here, the radial magnetic field penetration is defined as the radial distance measured from the chamber wall inner surface 128 inward into the process volume 126 up to a point where the magnetic field falls below 5 Gauss (the magnetic field decreases in magnitude while moving inward toward the center of the process volume 126). This radial distance is measured at various azimuthal positions for the chamber and the average value of these measured distances is presented as a percentage of chamber wall radius. For context, an average radial penetration of magnetic field measured as 100% of chamber wall radius would imply the magnetic field inside the process volume 126 remains above 5 Gauss all the way up to the chamber center indicating full penetration of magnetic field from chamber wall inner surface 128 to the center of the process volume 126. Also, an average radial penetration of magnetic field measured as 0% of chamber wall radius would imply the magnetic field inside the process volume 126 remains below 5 Gauss all the way up to the chamber wall inner surface 128 indicating zero penetration of magnetic field from chamber wall inner surface 128.

Figure 4B:
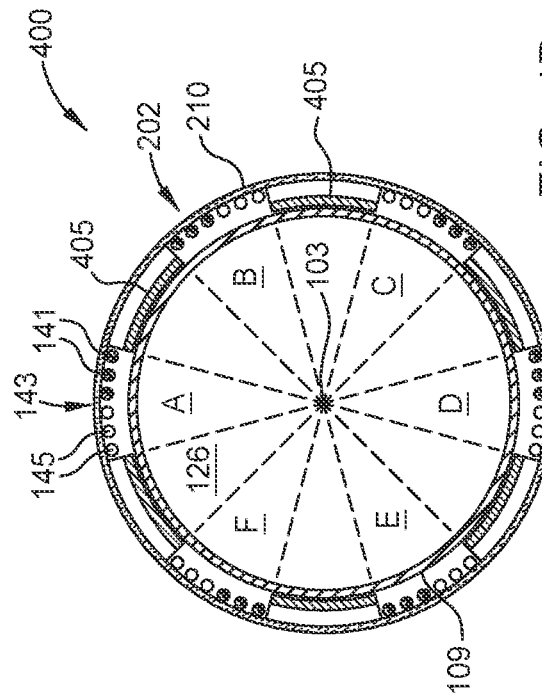
FIG. 4B is a sectional view along lines 4B-4B of FIG. 4A.
Figure 4C:
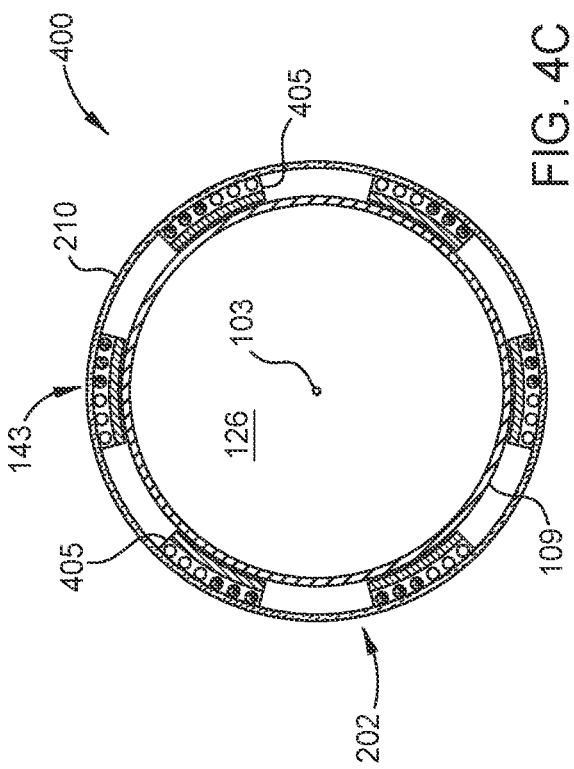
FIG. 4C is a sectional view similar to FIG. 4B with the shunt doors in a second position.
Figure 4A:
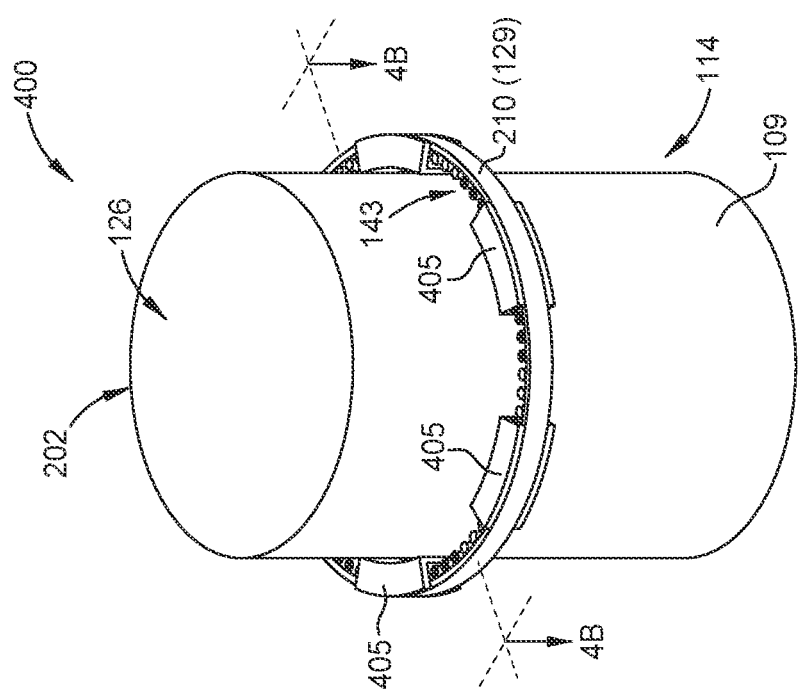
FIG. 4A is an isometric view of another embodiment of a movable shunt door system wherein shunt doors are in a first position.
Figure 5B:
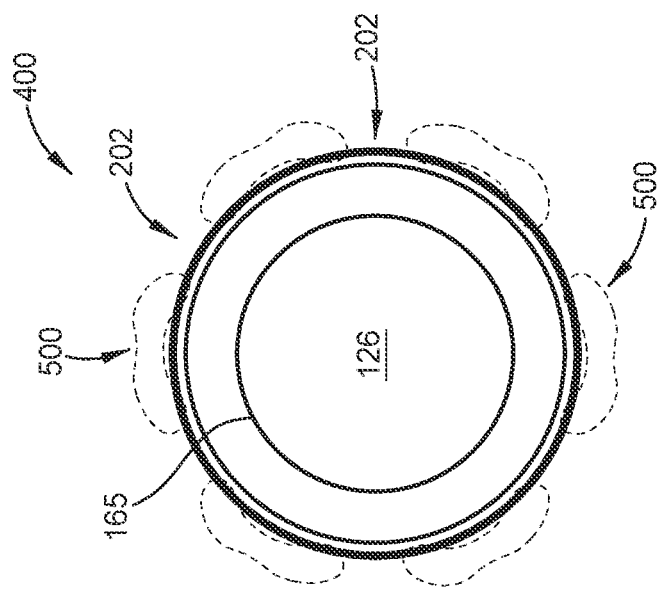
FIGS. 5A and 5B are schematic sectional views of the chamber body showing the B-field magnitude in the chamber when the shunt doors are in the first position and the second position, respectively.
Figure 5A:
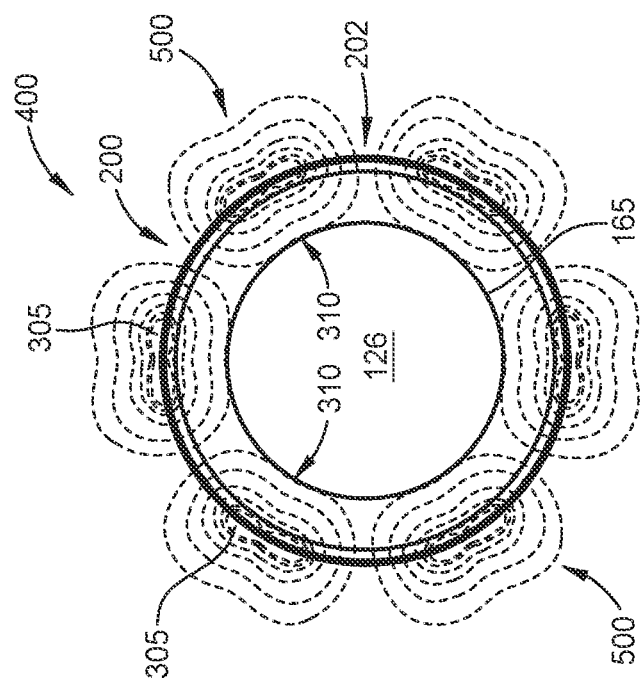

FIGS. 4A-4C are various views of one embodiment of a movable shunt door system 400. FIG. 4A is an isometric view of a portion of a chamber body 202, which may be the chambers 101a, 101b of FIG. 1A. In this embodiment, six shunt doors 405 are shown, which are the shunt doors 186 described in FIGS. 1A and 1B. A sleeve 210 that retains the magnets 143, which is the retaining bracket 129 shown in FIGS. 1A and 1B, is shown in FIGS. 4A-4C. FIG. 4B is a sectional view along lines 4B-4B of FIG. 4A showing the shunt doors 405 in a first (open) position. FIG. 4C is a sectional view similar to FIG. 4B with the shunt doors 405 in a second (closed) position. While an isometric view as shown in FIG. 2D above, and the sectional view as shown in FIG. 2C above, is not shown, the shunt door system 400 is otherwise constructed and operates similarly to the shunt door system 200 described above. In addition, FIGS. 5A and 5B are schematic sectional views of the chamber body 202 showing the B-field magnitude of the magnets 143 when the shunt doors 405 are in the open position as shown in FIG. 4B and the closed position in FIG. 4C, respectively. The outline of the substrate 165 is shown in the process volume 126 of the chamber body 202 of FIGS. 5A and 5B.

In this embodiment, which can be combined with other embodiments as described herein, the chamber body 202 is divided magnetically into multiple portions, such as sextants A-F (shown in FIG. 4B). The process volume 126 may be divided into do decants with alternating magnetic zones and non-magnetic zones. Opposing sextants A/D, B/E and C/F include a plurality of magnets 143 while other portions do not include magnets 143. In addition, one half of the plurality of magnets 143 in sextants A-F have the south pole 145 oriented toward the center longitudinal axis 103 of the process volume 126 while the other half have the north pole 141 oriented toward the center longitudinal axis 103 of the process volume 126. The North pole 141/south pole 145 divide is the center of each of the respective sextants A-F.

In FIGS. 4A and 4B, the shunt doors 405 are in an open position while in FIG. 4C, the shunt doors 405 are in a closed position. The open position allows a strong B-field in the process volume 126 for uniform deposition, and in the closed position, the B-field is minimized in the process volume 126, which allows enhanced particle purge (cleaning of the process volume 126). The open and closed position may be provided as described above.

The B-field is referenced as reference numeral 500 and is shown schematically in FIGS. 5A and 5B with no rotational movement of the magnets 143 relative to the process volume 126. FIG. 5A shows a magnitude of the B-field 500 when the shunt doors 405 are in the open position as shown in FIG. 4B. The dashed lines in FIG. 5A shows the magnitude of the B-field 500 at the center volume 305 that decreases toward the peripheral volume 310. FIG. 5B shows the magnitude of the B-field 500 when the shunt doors 405 are in the closed position which effectively lowers the intensity of the B-field 500 as compared to the magnitude shown in FIG. 5A. In one example, the magnitude of the B-field 500 shown in FIG. 5B is less than the magnitude of the B-field 500 at the peripheral volume 310 of FIG. 5A. In another example, the average B-field 500 inside the process volume 126 of FIG. 5A is about 12.5 Gauss while the average B-field 500 is about 0.34 Gauss inside the process volume 126 of FIG. 5B. In another example, the average magnetic field penetration inside the process volume 126 as a radial distance from the chamber wall (e.g., the outer wall 109 of the spacer 114) inwards where the magnetic field is greater than 5 Gauss (in percentage of a chamber wall radius) in the open position (FIG. 5A) is about 25.5% of the chamber wall radius. In contrast, the average magnetic field penetration inside the process volume 126 in the closed position (FIG. 5B) is about 0.21% of the chamber wall radius. Here, the radial magnetic field penetration is defined as the radial distance measured from the chamber wall inner surface 128 inward into the process volume 126 up to a point where the magnetic field falls below 5 Gauss (the magnetic field decreases in magnitude while moving inward as noted above). This radial distance is measured at various azimuthal positions for the chamber and the average value of these measured distances is presented as a percentage of chamber wall radius.

Figure 7B:
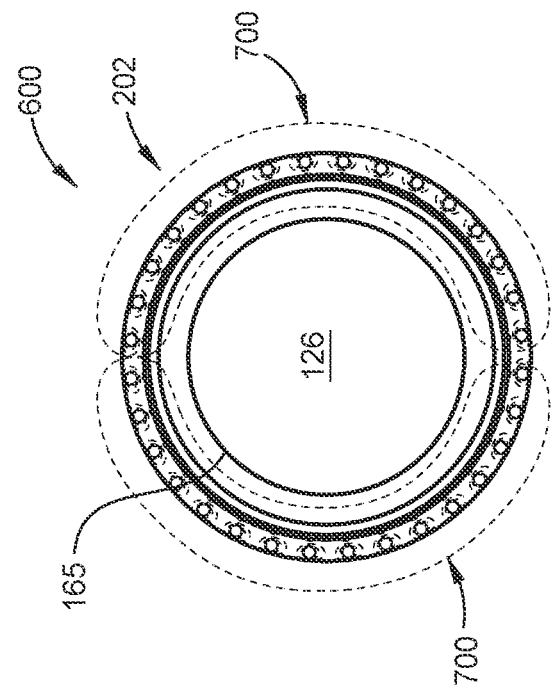
FIGS. 7A and 7B are schematic sectional views of the chamber body showing the B-field magnitude in the chamber when the shunt doors are in the first position and the second position, respectively.
Figure 7A:
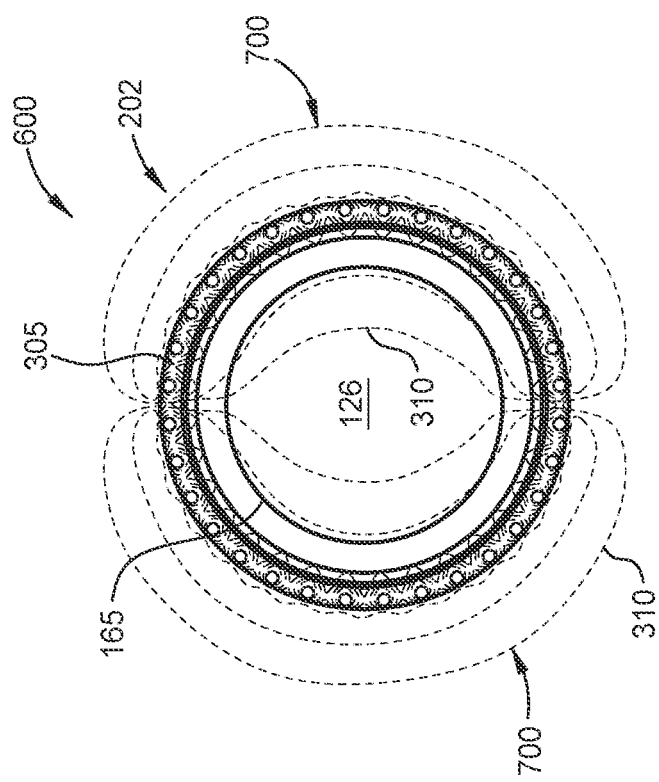

FIGS. 6A-6C are various views of one embodiment of a movable shunt door system 600. FIG. 6A is an isometric view of a portion of a chamber body 202, which may be the chambers 101a, 101b of FIG. 1A. In this embodiment, multiple shunt doors 605 are shown, which are the shunt doors 186 described in FIGS. 1A and 1B. A sleeve 210 that retains the magnets 143, which is the retaining bracket 129 shown in FIGS. 1A and 1B, is shown in FIGS. 6A-6C. FIG. 6B is a sectional view along lines 6B-6B of FIG. 6A showing the shunt doors 605 in a first (open) position. FIG. 6C is a sectional view similar to FIG. 6B with the shunt doors 605 in a second (closed) position. While an isometric view as shown in FIG. 2D above, and the sectional view as shown in FIG. 2C above, is not shown, the shunt door system 600 is otherwise constructed and operates similarly to the shunt door system 200 described above. In addition, FIGS. 7A and 7B are schematic sectional views of the chamber body 202 showing the B-field magnitude of the magnets 143 when the shunt doors 605 are in the open position as shown in FIG. 6B and the closed position in FIG. 6C, respectively. The outline of the substrate 165 is shown in the process volume 126 of the chamber body 202 of FIGS. 7A and 7B.

The process volume 126 may be divided into halves A and B each having alternating magnetic zones and non-magnetic zones. Half A and half B each include a plurality of magnets 143. In half A, the south pole 145 of each of the magnets 143 is oriented toward the center longitudinal axis 103 of the process volume 126 while the half B has the north pole 141 of each of the magnets 143 oriented toward the center longitudinal axis 103 of the process volume 126. The North pole 141/South pole 145 divide is the center of each of the respective halves A and B.

In FIGS. 6A and 6B, the shunt doors 605 are in an open position while in FIG. 6C, the shunt doors 605 are in a closed position. The open position allows a strong B-field in the process volume 126 for uniform deposition, and in the closed position, the B-field is minimized in the process volume 126, which allows enhanced particle purge (cleaning of the process volume 126). The open and closed position may be provided as described above.

The B-field is referenced as reference numeral 700 and is shown schematically in FIGS. 7A and 7B with no rotational movement of the magnets 143 relative to the process volume 126. FIG. 7A shows a magnitude of the B-field 700 when the shunt doors 605 are in the open position as shown in FIG. 6B. The dashed lines in FIG. 7A shows the magnitude of the B-field 700 at the center volume 305 that decreases toward the peripheral volume 310. FIG. 7B shows the magnitude of the B-field 700 when the shunt doors 605 are in the closed position which effectively lowers the intensity of the B-field 700 as compared to the magnitude shown in FIG. 7A. In one example, the magnitude of the B-field 700 shown in FIG. 7B is less than the magnitude of the B-field 700 at the peripheral volume 310 of FIG. 7A. In another example, the average B-field 700 inside the process volume 126 of FIG. 7A is about 18.8 Gauss while the average B-field 700 is about 4.0 Gauss inside the process volume 126 of FIG. 7B. In another example, the average magnetic field penetration inside the process volume 126 as a radial distance from the chamber wall (e.g., the outer wall 109 of the spacer 114) inwards where the magnetic field is greater than 5 Gauss (in percentage of a chamber wall radius) in the open position (FIG. 7A) is about 40.7% of the chamber wall radius. In contrast, the average magnetic field penetration inside the process volume 126 in the closed position (FIG. 7B) is about 14.2% of the chamber wall radius. Here, the radial magnetic field penetration is defined as the radial distance measured from the chamber wall inner surface 128 inward into the process volume 126 up to a point where the magnetic field falls below 5 Gauss (magnetic field decreases in magnitude while moving inward as noted above). This radial distance is measured at various azimuthal positions for the chamber and the average value of these measured distances is presented as a percentage of chamber wall radius.

Figure 8B:
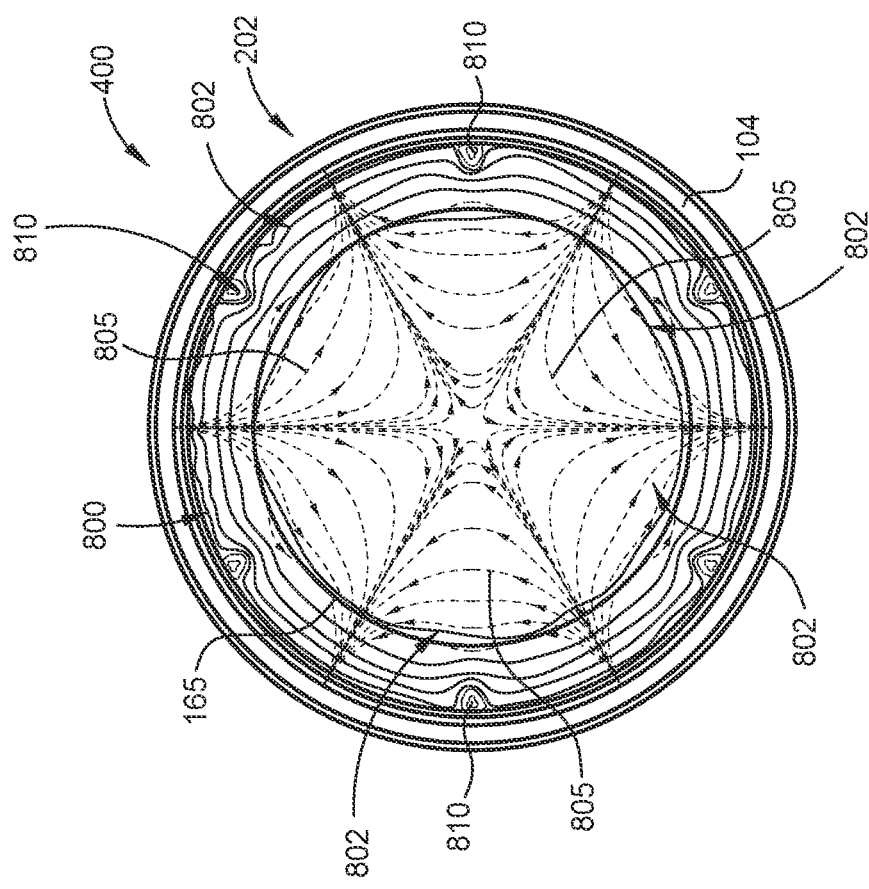
FIG. 8B is a schematic representation of the plasma drift at bulk plasma-sheath interface utilizing the movable shunt door system as shown in FIGS. 4A and 4B.
Figure 8A:
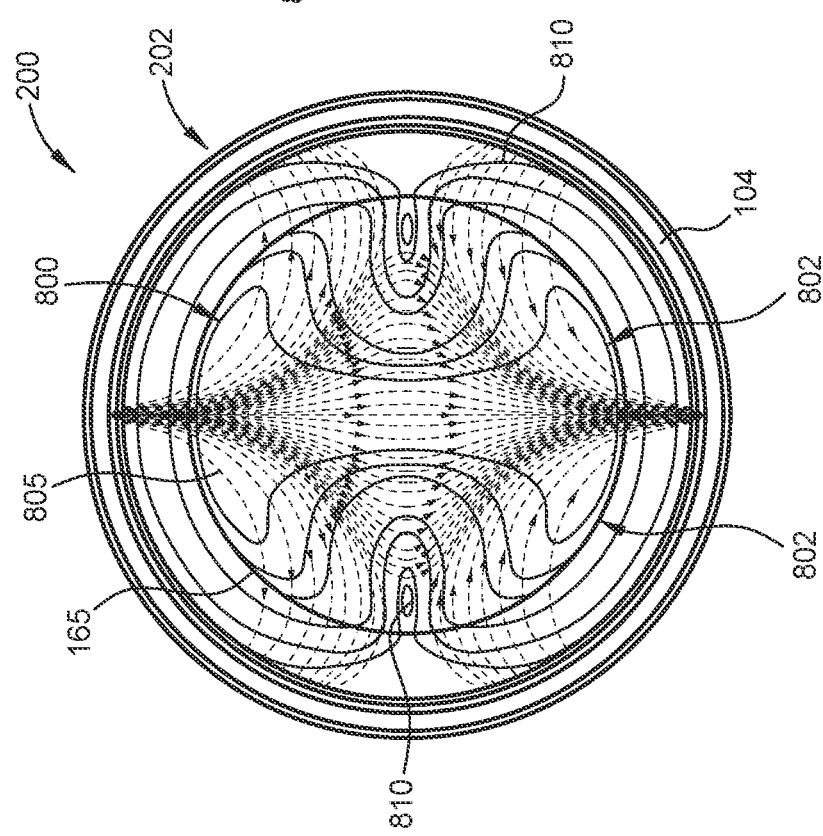
FIG. 8A is a schematic representation of the plasma drift at bulk a plasma-sheath interface utilizing the movable shunt door system as shown in FIGS. 2A and 2B.
Figure 8C:
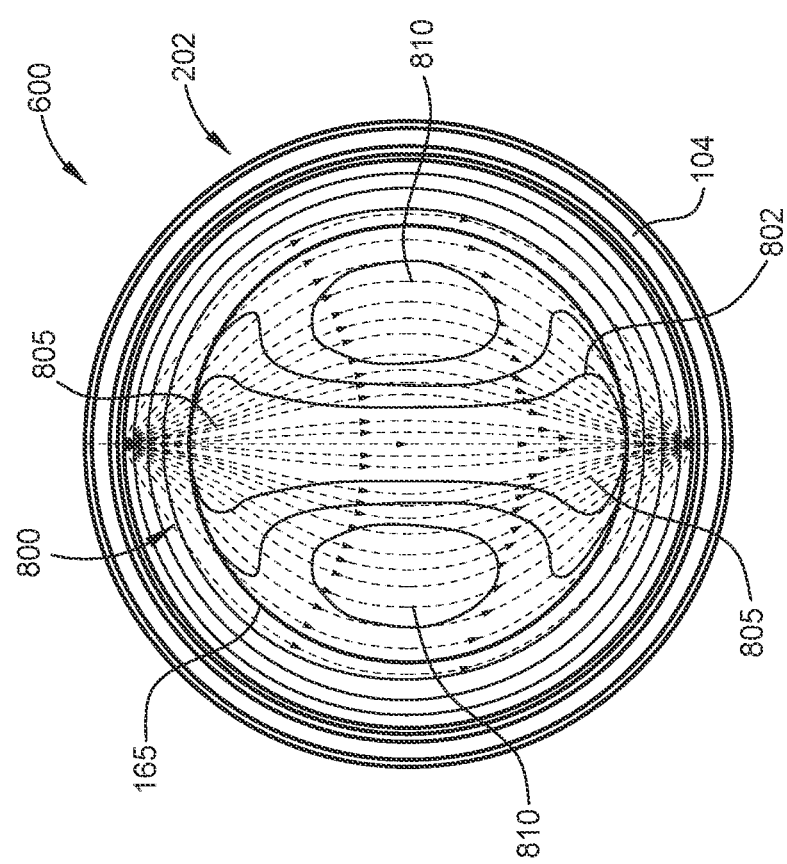
FIG. 8C is a schematic representation of the plasma drift at bulk plasma-sheath interface utilizing the movable shunt door system as shown in FIGS. 6A and 6B.

FIGS. 8A-8C are schematic sectional top views of a plasma drift magnitude 800 and direction 805 at bulk plasma-sheath interface during processing utilizing the rotational magnetic housing 104 of FIGS. 1A and 1B, and the movable shunt door systems as described herein. In each of the embodiments shown, there are a plurality of magnets (not shown) in the rotational magnetic housing 104. As an example, the number of magnets may be about 32 magnets, 36 magnets, 40 magnets, or greater. Additionally, RF energy is applied with the shunt doors (not shown) in the open position with rotation of the magnets. The plasma drift velocity magnitude is shown using solid contour lines while plasma drift velocity direction is shown using dashed lines (with arrows). The edge of the substrate 165 is also shown using a thicker solid line.

FIG. 8A is a schematic representation of the plasma drift magnitude 800 and direction 805 at plasma-sheath interface utilizing the movable shunt door system 200 as shown in FIGS. 2A and 2B. The bulk plasma-sheath interface includes a region 802 of high intensity plasma drift. The bulk plasma-sheath interface also includes region 810 of lower intensity plasma drift. The region 802, with the higher plasma drift facilitates redistribution of plasma density resulting in higher deposition on the edge of the substrate 165 changing the center high deposition profile to a radially uniform deposition profile. While no rotation is shown, the region 802 would rotate with the rotation of the magnets during processing, which facilitates uniform deposition on the entirety of the substrate 165 by spreading the radial plasma drift effect azimuthally.

FIG. 8B is a schematic representation of the plasma drift magnitude 800 and direction 805 at the plasma-sheath interface utilizing the movable shunt door system 400 as shown in FIGS. 4A and 4B. The bulk plasma-sheath interface includes regions 802 of high intensity plasma drift. The bulk plasma-sheath interface also includes regions 810 of lower intensity plasma drift. The regions 802, with the higher plasma drift facilitates redistribution of plasma density resulting in higher deposition on the edge of the substrate 165 changing the center high deposition profile to a radially uniform deposition profile. While no rotation is shown, the region 802 would rotate with the rotation of the magnets during processing, which facilitates uniform deposition on the entirety of the substrate 165 by spreading the radial plasma drift effect azimuthally.

FIG. 8C is a schematic representation of the plasma drift magnitude 800 and direction 805 at plasma-sheath interface utilizing the movable shunt door system 600 as shown in FIGS. 6A and 6B. The bulk plasma-sheath interface includes regions 802 of high intensity plasma drift. The bulk plasma-sheath interface also includes regions 810 of lower intensity plasma drift. The regions 802, with the higher plasma drift facilitate redistribution of plasma density resulting in higher deposition on the edge of the substrate 165 changing the center high deposition profile to a radially uniform deposition profile. While no rotation is shown, the region 802 would rotate with the rotation of the magnets during processing, which facilitates uniform deposition on the entirety of the substrate 165 by spreading the radial plasma drift effect azimuthally.

Embodiments of the rotational magnetic housing 104 of FIGS. 1A and 1B, and the movable shunt door systems as described herein provide enhanced and more uniform deposition during processing and also, enhanced chamber cleaning after processing. For example, the movable shunt door system 200 as shown in FIGS. 2A, 2B, 2D and 2E provides greater than about a 98% reduction in the average B-field intensity in the process volume 126. As another example, the movable shunt door system 400 as shown in FIGS. 4A-4C provides greater than about 97% reduction in the average B-field intensity in the process volume 126. As another example, the movable shunt door system 600 as shown in FIGS. 6A-6C provides greater than about 78% reduction in the average B-field intensity in the process volume 126. In all of these embodiments with the shunt doors in open position, the average radial B-field penetration in the process volume 126 (as a percent of chamber wall radius) is between about 25% to about 40%, which provides enhanced and more uniform deposition during processing. In addition, the radial B-field penetration in the movable shunt door systems 200 (FIGS. 2A, 2B, 2D and 2E), 400 (FIGS. 4A-4C), 600 (FIGS. 6A-6C) reduces by at least 85% when the shunt doors are moved from the open position to the closed position at the end of the process. This indicates the possibility of significant reduction in average B-field inside the chamber and also near complete removal of the B-field penetration into the chamber using these movable shunt door systems at the end of the process that will lead to enhanced purge cleaning.

While the foregoing is directed to examples of the present disclosure, other and further examples of the disclosure may be devised without departing from the basic scope thereof, and the scope thereof is determined by the claims that follow.

What is claimed is:

1. A system comprising:
    a chamber comprising:
        an interior volume and an exterior sidewall disposed around the interior volume; and
        a substrate support in the interior volume;
    a rotational magnetic housing disposed about the exterior sidewall of the chamber, the rotational magnetic housing comprising:
        a sleeve;
        a plurality of magnets coupled to the sleeve, the plurality of magnets configured to travel along a path around the chamber when the rotational magnetic housing is rotated around the chamber; and
        a plurality of shunt doors disposed between the chamber and the sleeve; and
    a controller configured to execute instructions to cause each of the shunt doors to move relative to the magnets from an open position to a closed position to shield the interior volume of the chamber from magnetic fields from the plurality of magnets when in the closed position and to reduce an intensity of the magnetic fields in the interior volume in the closed position relative to the open position.

2. The system of claim 1, wherein the plurality of shunt doors comprises two shunt doors, wherein each shunt door of the two shunt doors is on an opposing side of the chamber relative to the other shunt door of the two shunt doors.

3. The system of claim 1, wherein the plurality of shunt doors comprises six shunt doors, and at least two of the six shunt doors are on opposing sides of the chamber.

4. The system of claim 3, wherein pairs of shunt doors are on opposing sides of the chamber.

5. The system of claim 1, wherein the plurality of shunt doors comprises a shunt door corresponding to each magnet of the plurality of magnets.

6. The system of claim 1, wherein each of the shunt doors comprises a central wall and two outer walls, each outer wall attached to an opposing end side of the central wall, and each outer wall extending generally orthogonally from the central wall forming a "C" shape.

7. The system of claim 1, wherein each of the shunt doors comprises a body that is configured to at least partially surround at least one magnet of the plurality of magnets.

8. The system of claim 1, wherein each of the plurality of shunt doors comprises a material having a relative magnetic permeability ($\mu_r$) of about 80,000.

9. The system of claim 1, wherein each of the plurality of shunt doors is coupled to an actuator.

10. A system comprising:
    a chamber comprising:
        an interior volume and an exterior surface disposed around the interior volume; and
        a substrate support in the interior volume;
    a rotational magnetic housing disposed about the chamber, the rotational magnetic housing comprising:
        a sleeve;
        a plurality of magnets coupled to the sleeve, the plurality of magnets configured to travel along a path about the exterior surface of the chamber; and
    a plurality of shunt doors disposed between the exterior surface of the chamber and the sleeve; and
    a controller configured to execute instructions to cause each of the shunt doors to move relative to the magnets, and to cause the magnets to move relative to the plurality of shunt doors from an open position to a closed position to shield the interior volume of the chamber from magnetic fields from the plurality of magnets when in the closed position and to reduce an intensity of the magnetic fields in the interior volume in the closed position relative to the open position.

11. The system of claim 10, wherein each of the shunt doors comprises a central wall and two outer walls.

12. The system of claim 11, wherein each of the two outer walls extend generally orthogonally from the central wall forming a "C" shape.

13. The system of claim 10, wherein each of the shunt doors comprises a body that is configured to at least partially surround at least one magnet of the plurality of magnets.

14. The system of claim 10, wherein each of the plurality of shunt doors comprises a material with a relative magnetic permeability ($\mu_r$) of about 80,000.

15. The system of claim 10, wherein the plurality of shunt doors comprises two shunt doors, wherein each shunt door of the two shunt doors is on an opposing side of the chamber relative to the other shunt door of the two shunt doors.

16. The system of claim 10, wherein the plurality of shunt doors comprises six shunt doors, and at least two of the six shunt doors are on the opposite sides of the chamber.

17. The system of claim 10, wherein the plurality of shunt doors comprises a shunt door corresponding to each magnet of the plurality of magnets.

18. A system comprising:
a chamber comprising:
- a chamber body including an exterior sidewall disposed around an interior volume;
- a chamber lid having a gas distribution assembly configured to provide gas to the interior volume; and
- a substrate support positioned in the interior volume opposite the gas distribution assembly;

a radio frequency (RF) source operable to be coupled to an electrode disposed within substrate support; and a rotational magnetic housing disposed about the exterior sidewall of the chamber, the rotational magnetic housing comprising:
- a sleeve;
- a plurality of magnets coupled to the sleeve that are configured to travel along a path around the chamber when the rotational magnetic housing is rotated around the chamber; and
- a plurality of shunt doors movably disposed between the chamber and the sleeve; and
- a controller configured to execute instructions to cause each of the shunt doors to move relative to the magnets from an open position to a closed position to shield the interior volume of the chamber from magnetic fields from the plurality of magnets when the plurality of shunt doors are in the closed position to reduce an intensity of the magnetic fields in the interior volume in the closed position relative to the open position.

19. The system of claim 18, wherein the plurality of shunt doors comprises two shunt doors, wherein each shunt door of the two shunt doors is on an opposing side of the chamber relative to the other shunt door of the two shunt doors.

20. The system of claim 18, wherein each of the plurality of shunt doors comprises a material with a relative magnetic permeability ($\mu_r$) of about 80,000.

* * * * *